United States Patent
Huang et al.

(10) Patent No.: US 9,063,435 B2
(45) Date of Patent: Jun. 23, 2015

(54) EXPOSURE ADJUSTING APPARATUS, IMAGE NORMALIZING APPARATUS AND IMAGE NORMALIZING METHOD

(71) Applicant: PixArt Imaging Inc., Hsin-Chu (TW)

(72) Inventors: Yu-Hao Huang, Hsin-Chu (TW); Ming-Tsan Kao, Hsin-Chu (TW); Sen-Huang Huang, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/888,374

(22) Filed: May 7, 2013

(65) Prior Publication Data
US 2014/0133876 A1    May 15, 2014

(30) Foreign Application Priority Data
Nov. 13, 2012  (TW) .............................. 101142203 A

(51) Int. Cl.
*G03B 7/08*   (2014.01)
*G03F 7/20*   (2006.01)

(52) U.S. Cl.
CPC .................................. *G03F 7/70483* (2013.01)

(58) Field of Classification Search
CPC ................................................... H04N 5/2356
USPC ........................................................ 396/233
See application file for complete search history.

(56) References Cited

U.S. PATENT DOCUMENTS

| | | | | |
|---|---|---|---|---|
| 5,625,411 A * | 4/1997 | Inuiya et al. | ............... | 348/220.1 |
| 2001/0013903 A1 * | 8/2001 | Suzuki et al. | ................. | 348/362 |
| 2008/0204575 A1 * | 8/2008 | Shiga et al. | ................ | 348/229.1 |
| 2009/0322899 A1 * | 12/2009 | Chan et al. | ................ | 348/222.1 |

\* cited by examiner

*Primary Examiner* — Clayton E Laballe
*Assistant Examiner* — Dennis Hancock
(74) *Attorney, Agent, or Firm* — Winston Hsu; Scott Margo

(57) ABSTRACT

An exposure adjusting apparatus, which comprises: an image sensor, for catching an image according to an exposure parameter; a computing apparatus, for computing an exposure amount of the image and for determining whether the exposure amount is in a predetermined exposure range or not; and an exposure updating apparatus. If the exposure amount is in the predetermined exposure range, the exposure updating apparatus does not adjust the exposure amount. If the exposure amount is not in the predetermined exposure range, the exposure updating apparatus generates at least one adjusting amount according to at least one of the predetermined exposure range, the exposure amount and the exposure parameter, and utilizes the adjusting amount to increase or decrease the exposure parameter to generate a new exposure parameter.

3 Claims, 7 Drawing Sheets

EXPOSURE ADJUSTING APPARATUS, IMAGE NORMALIZING APPARATUS AND IMAGE NORMALIZING METHOD

BACKGROUND OF THE INVENTION

1. Field of the Invention

The present invention relates to an exposure adjusting apparatus, an image normalizing apparatus and an image normalizing method, and particularly relates to an exposure adjusting apparatus, an image normalizing apparatus and an image normalizing method which can adjust the exposure parameter via variable adjusting amounts.

2. Description of the Prior Art

Since the image digitalizing technique improves, the electronic apparatus utilizing the digital image such as a digital camera, a video camera and an optical mouse are developed and become popular. Such product always includes an image sensor, which can catch an image for the electronic apparatus. Also, the image sensor can adjust the exposure parameter of the image sensor according to an exposure amount of the image, to adjust the exposure amount of the image such that the image won't be overexposed or underexposed (i.e. the brightness is too high or too low).

FIG. 1 is a circuit diagram illustrating a prior art CMOS image sensor. As shown in FIG. 1, the image sensor 100 includes a pixel array 101, a signal reading circuit 103, an amplifier 111 and an analog to digital converter 113. The pixel array 101 includes a plurality of pixel units $PIX_{11}$-$PIX_{nm}$. If the image sensor 100 wants to read an image, the signal reading circuit 103 reads pixel signals in the pixel array 101, and then the amplifier 111 amplifies the pixel signal. After that, the analog to digital converter 113 transfers the pixel signal to a digital form, such that the following digital signal processor 115 can process the digitalized pixel signal. The signal reading circuit 103 has a plurality of signal reading units $SR_1$, $SR_2$ and $SR_3$, for reading pixel signals from the pixel units $PIX_{11}$-$PIX_{nm}$.

FIG. 2 is a circuit diagram illustrating the pixel array 101 shown in FIG. 1. The cross voltage of a photo diode PD is charged to $V_{rst}$ if the reset signal RES controls the NMOS $M_2$ to be conductive. The signal reading units $SR_1$, $SR_2$, $SR_3$ in the signal reading circuit 103 all include an energy storing device. If the NMOS $M_3$ is controlled to be conductive via the pixel selecting signals $RSEL_1$ or $RSEL_2$, the cross voltage of the photo diode PD is transformed to a current via the NMOS $M_1$, and the current is stored to the energy storing devices in the signal reading units $SR_1$, $SR_2$, $SR_3$. By this way, the charge stored by the energy storing devices of the signal reading units $SR_1$, $SR_2$, $SR_3$ indicate the light amount sensed by the corresponding pixel. The illumination intensity and illumination time for the light sensed by the photo diode PD can be regarded as exposure intensity and exposure time of the photo diode PD. The exposure amount of the pixel unit is generated vian exposure intensity×exposure time. Additionally, a mean value for the exposure amount of all pixel units can be regarded as exposure amount of a whole image. Accordingly, if the exposure amount of the image is desired to be in a predetermined exposure range, illumination intensity and illumination time for the light sensed by the photo diode PD (i.e. the exposure parameter) can be adjusted to change the exposure intensity and the exposure time of the image.

In the prior art, the step of adjusting the exposure parameter always adjusts the exposure parameter for a fixed value per time. For example, if the exposure parameter is 100 units and the image exposure amount is too large, then the exposure parameter decreases for 10 units and the new exposure parameter is utilized to catch an image. However, if the exposure parameter is 1000 units but still decreases for 10 units per time, the exposure parameter decreases too slowly and the exposure parameter must be adjusted for many times to control the exposure amount of the image to fall in the desired range. On the contrary, if the exposure parameter is 100 units but decreases for 40 units or more per time, the exposure time is uneasy to be adjusted to the desired range.

SUMMARY OF THE INVENTION

One objective of the present invention is to provide an exposure adjusting apparatus, which can change the adjusting amount for an exposure parameter according to different situations, such that the exposure amount of the image can be adjusted to a predetermined exposure range.

Another objective of the present invention is to provide an image normalizing apparatus and an image normalizing method, which can change the adjusting amount for an exposure parameter according to different situations, such that the exposure amount of two images can be adjusted to be substantially the same.

One embodiment of the present invention discloses an exposure adjusting apparatus, which comprises: an image sensor, for catching an image according to an exposure parameter; a computing apparatus, for computing an exposure amount of the image and for determining whether the exposure amount is in a predetermined exposure range or not; and an exposure updating apparatus. If the exposure amount is in the predetermined exposure range, the exposure updating apparatus does not adjust the exposure amount. If the exposure amount is not in the predetermined exposure range, the exposure updating apparatus generates at least one adjusting amount according to at least one of the predetermined exposure range, the exposure amount and the exposure parameter, and utilizes the adjusting amount to increase or decrease the exposure parameter to generate a new exposure parameter.

Another embodiment of the present invention discloses a image normalizing apparatus, comprising: an image sensor, for catching a first image according to a first exposure parameter and for catching a second image according to a second exposure parameter; a computing apparatus, for computing a first exposure amount of the first image and a second exposure amount of the second image, and for computing an exposure difference between the first exposure amount and the second exposure amount; and an exposure updating apparatus. If the exposure difference is smaller or equals to a predetermined value, the exposure updating apparatus does not adjust the first exposure amount and the second exposure amount. If the exposure difference is larger than a predetermined value, the exposure updating apparatus generates at least one adjusting amount according to at least one of the first exposure amount, the second exposure amount and the exposure parameter, and utilizes the adjusting amount to increase or decrease the second exposure parameter to generate a third exposure parameter. The image sensor performs following image catching according to the third exposure parameter.

Still another embodiment of the present invention discloses a computer readable recording media, having at least one program code recorded thereon, an image normalizing method can be performed when the program code is read and executed, wherein the image normalizing method includes the following steps: (a) catching a first image according to a first exposure parameter and for catching a second image according to a second exposure parameter; (b) computing a first exposure amount of the first image and a second exposure amount of the second image, and computing an exposure difference between the first exposure amount and the second exposure amount; and (c) if the exposure difference is smaller or equals to a predetermined value, not adjusting the first exposure amount and the second exposure amount; if the exposure difference is larger than a predetermined value, generating at least one adjusting amount according to at least one of the first exposure amount, the second exposure amount and the exposure parameter, and utilizing the adjusting amount to increase or decrease the second exposure parameter to generate a third exposure parameter; and (d) performing following image catching according to the third exposure parameter.

In view of above-mentioned embodiments, the present invention utilizes a variable adjusting amount to adjust the exposure parameter, such that the exposure amount can be rapidly and accurately adjusted to a desired value or to fall in a desired range. Additionally, the present invention provides a mechanism for determining the adjusting amount via different parameters. By this way, the design for such kind of apparatus can be more unlimited.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
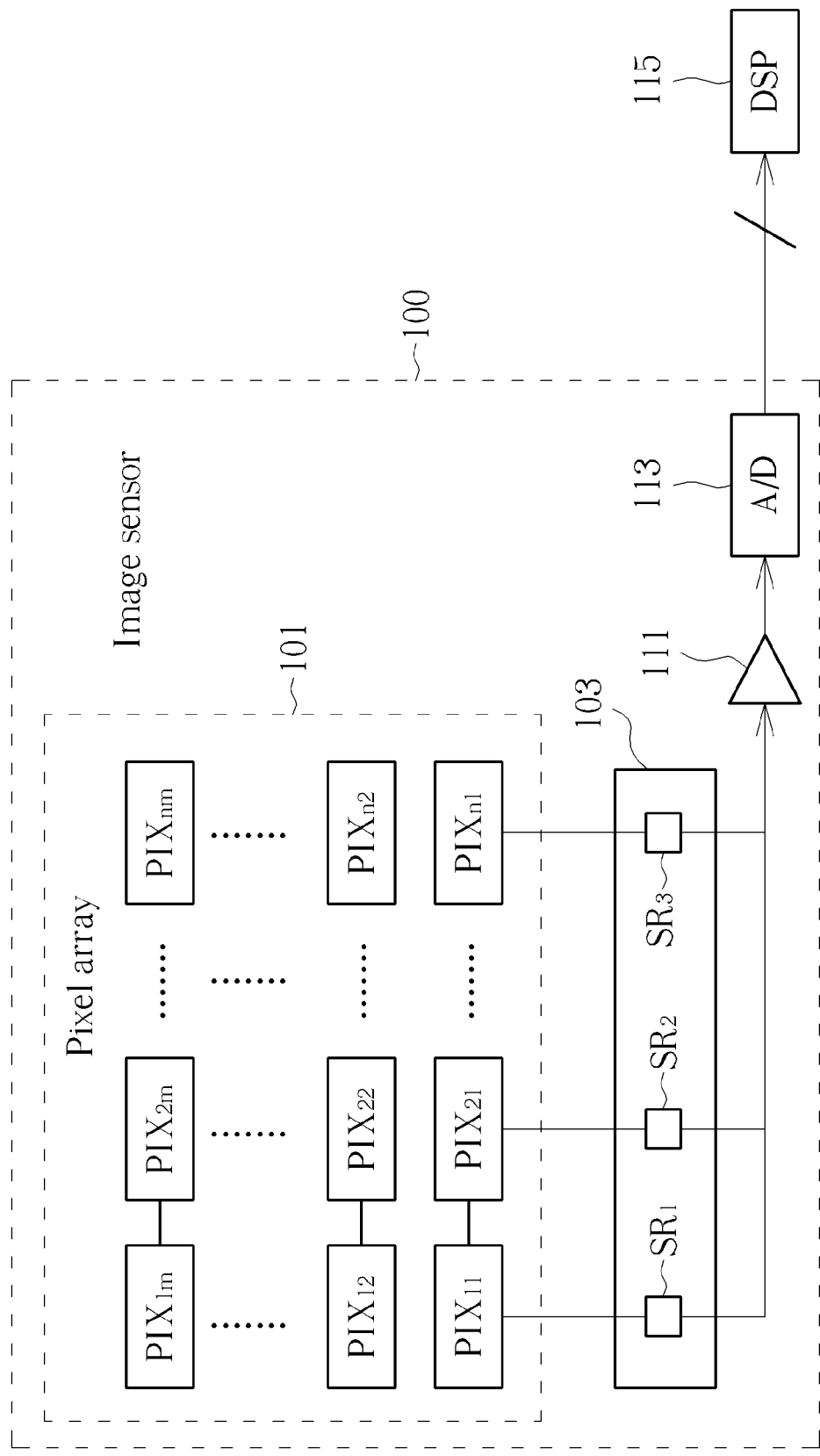
FIG. 1 is a circuit diagram illustrating a prior art CMOS image sensor.
Figure 2:
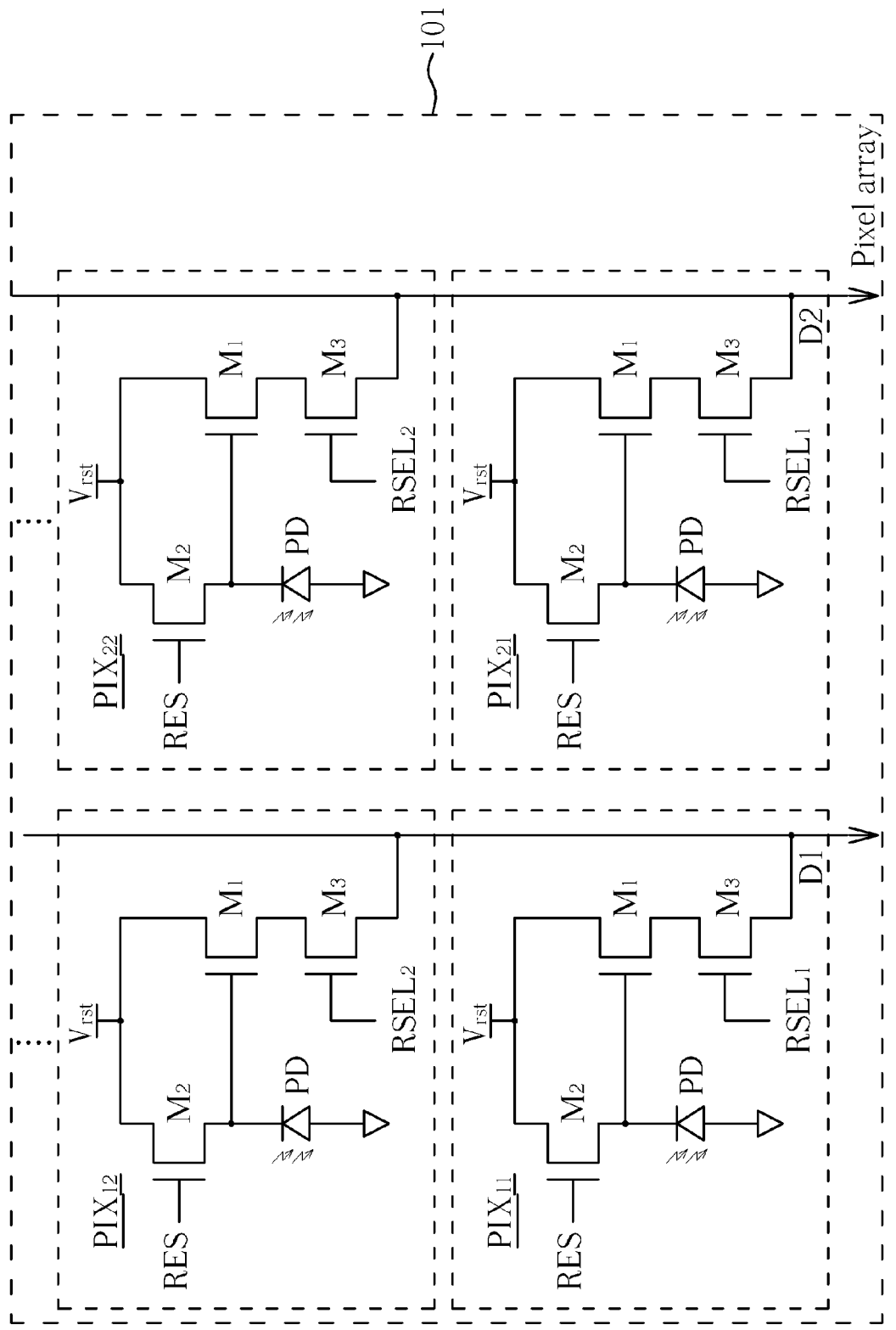
FIG. 2 is a circuit diagram illustrating the pixel array shown in FIG. 1.
Figure 3:
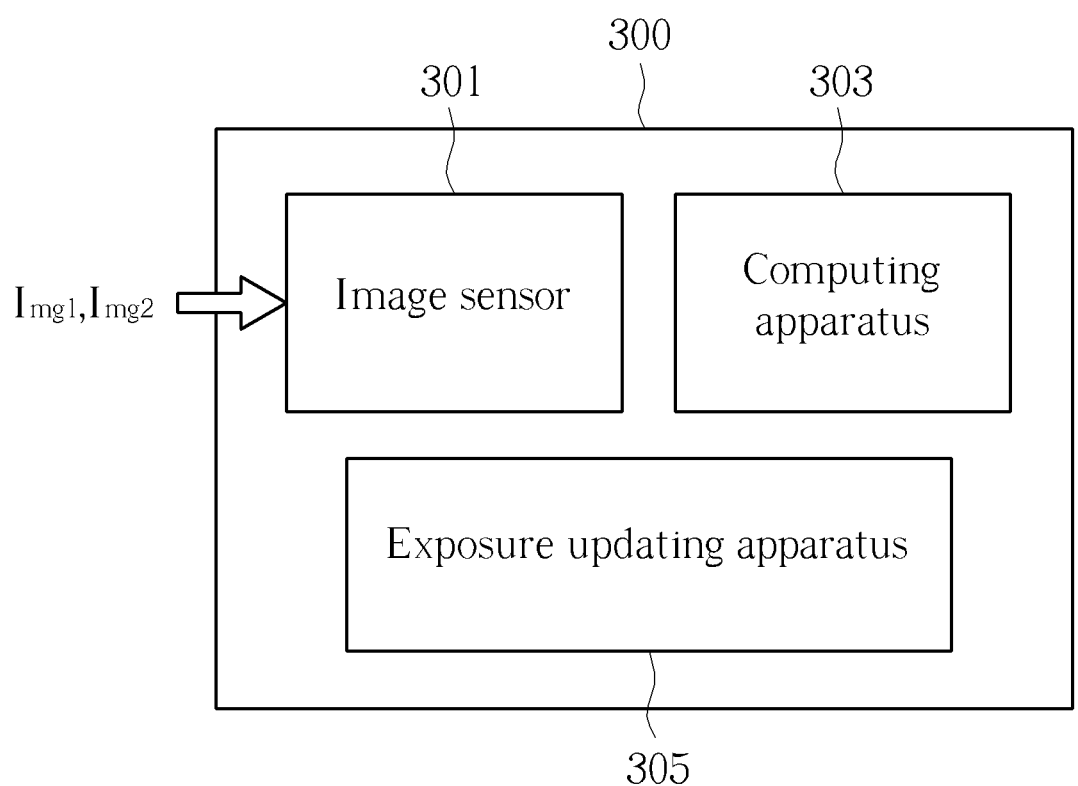
FIG. 3 is a block diagram illustrating an exposure adjusting apparatus according to the embodiment of the present invention.
Figure 4:
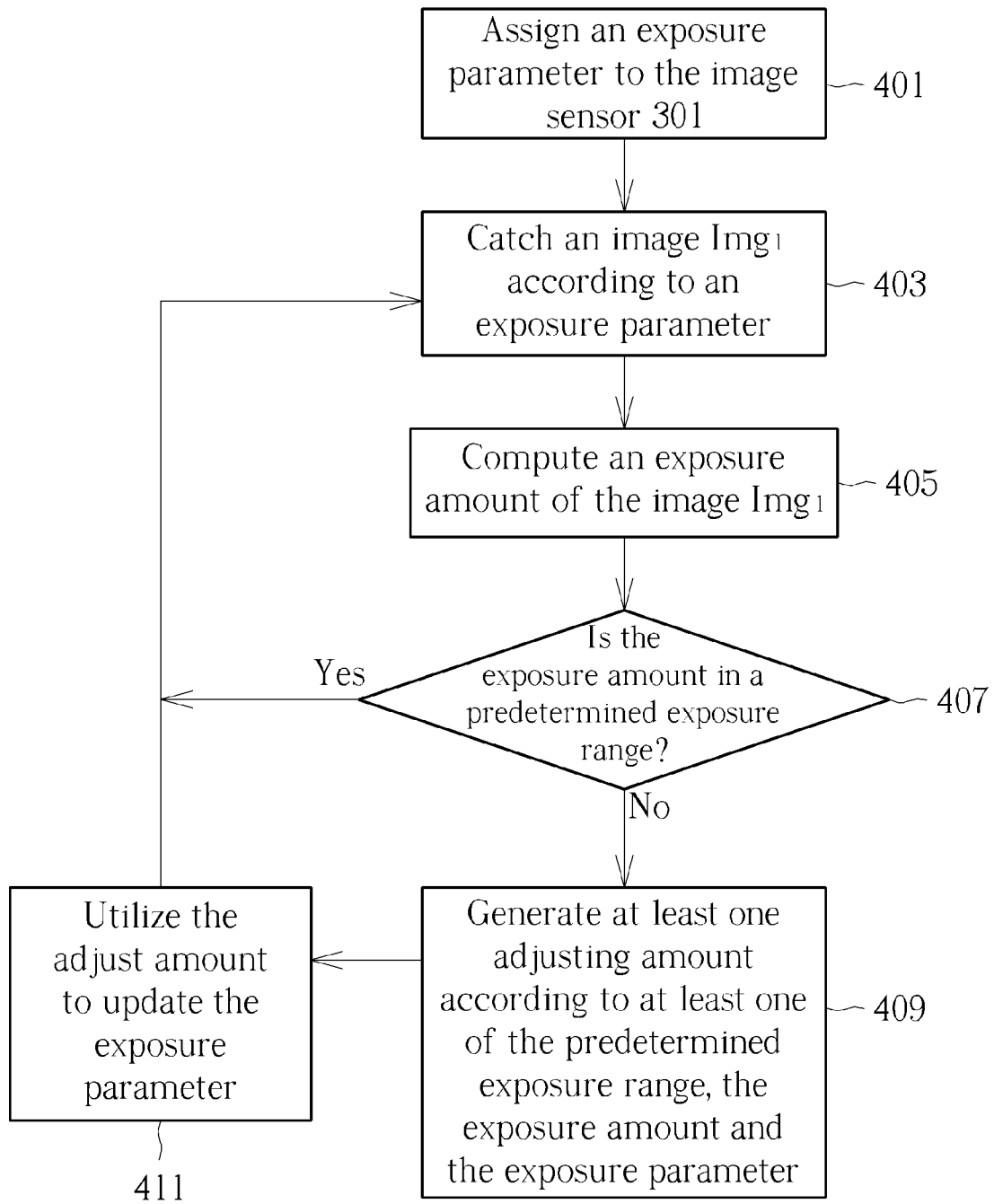
FIG. 4 is a flow chart illustrating the steps that the exposure adjusting apparatus shown in FIG. 3 utilizes to adjust the image.

FIG. 3 is a block diagram illustrating an exposure adjusting apparatus 300 according to the embodiment of the present invention. FIG. 4 is a flow chart illustrating the steps that the exposure adjusting apparatus shown in FIG. 3 utilizes to adjust the image. Please refer to both FIG. 3 and FIG. 4 to understand the process for adjusting exposure amount according to the present invention for more clear. As shown in FIG. 3, the exposure adjusting apparatus 300 includes an image sensor 301, a computing apparatus 303 and an exposure updating apparatus 305. The image sensor 301 can have structures shown in FIG. 1 and FIG. 2, but it is not limited. Other structures can be applied to the image sensor 301 as well. First, an exposure parameter is assigned to the image sensor 301 (step 401), and the image sensor 301 catches an image $Img_1$ according to an exposure parameter (step 403). The computing apparatus 303 computes an exposure amount of the image $Img_1$ (step 405). If the image sensor 301 utilizes the structure shown in FIG. 1 and FIG. 2, the image sensor 301 can perform the operation shown in FIG. 2. That is, the image sensor 301 respectively computes the exposure amount for each pixel unit and computes the exposure amount for all pixel units of the whole image sensor as the exposure amount of the image $Img_1$. However, other methods can also be utilized to compute the exposure amount besides the method described here. Since these methods are well known by persons skilled in the art, it is omitted for brevity here.

After that, determine whether the exposure amount is in a predetermined exposure range or not (step 407), that is, determine whether a value of the exposure amount is in a predetermined range or not. If yes, back to the step 403 and utilizes the previous exposure parameter to catch the image. If not, generate at least one adjusting amount according to at least one of the predetermined exposure range, the exposure amount and the exposure parameter (step 409), and utilizes the adjusting amount to update the exposure parameter (i.e. generate a new exposure parameter). Then, back to the step 403 to catch the image via the new exposure parameter.

In one embodiment, the exposure updating apparatus 305 utilizes the adjusting amount to increase the exposure parameter to generate the new exposure parameter when the exposure amount is in an exposure range smaller than the predetermined exposure range. Besides, the exposure updating apparatus 305 utilizes the adjusting amount to decrease the exposure parameter to generate the new exposure parameter when the exposure amount is in an exposure range larger than the predetermined exposure range. The adjusting amount can be determined by various methods. In one embodiment, the exposure updating apparatus 305 determines the adjusting amount according to difference between the exposure amount of the image and the predetermined exposure range. For example, if the predetermined exposure range is 100-120, the exposure amount is 220 and the exposure parameter is 512 units, the exposure updating apparatus 305 can compute a result that the exposure amount is 110 if the exposure parameter is 256 units. By this way, the exposure amount can fall in the predetermined exposure region, such that the adjusting amount is determined to be 256 units and the exposure parameter is updated to 256 units. Please note the exposure parameter described here is represented by "units". Such "unit" may indicate the illuminating intensity or illuminating time for the photo diode shown in FIG. 2, or indicates the combination of the illuminating intensity or illuminating time, or indicates other parameters or the combination thereof that can change the image exposure amount. The definition for "unit" may change corresponding to different structures of the image sensor.

Alternatively, the adjusting amount can equal to a percentage of the exposure parameter. For example, if the adjusting amount is set to be 25% and the exposure parameter is 100 units, the adjusting amount is 25 units. Also, if the exposure parameter is 1000 units, then the adjusting amount is 250 units. This percentage can be fixed, that is, the exposure updating apparatus 305 utilizes the same percentage to generate the adjusting amount per time. In one embodiment, the exposure updating apparatus 305 determines the percentage according to a value of the exposure parameter. For example, the percentage is larger if the exposure parameter is larger, and the percentage is smaller if the exposure parameter is smaller. In another embodiment, the exposure updating apparatus 305 determines the percentage according to the predetermined exposure range. For example, the percentage is larger if the predetermined exposure range is larger, and the percentage is smaller if the predetermined exposure range is smaller. In another embodiment, the exposure updating apparatus 305 determines the percentage according to difference between the exposure amount and the predetermined exposure range. For example, the percentage is larger if the difference is larger, such that the exposure amount can be roughly adjusted with a large adjusting amount such that the exposure amount can be rapidly adjusted to fall in the predetermined exposure range. On the contrary, the percentage is smaller if the difference is smaller, such that the exposure amount can accurately fall in the predetermined exposure range.

Figure 5:
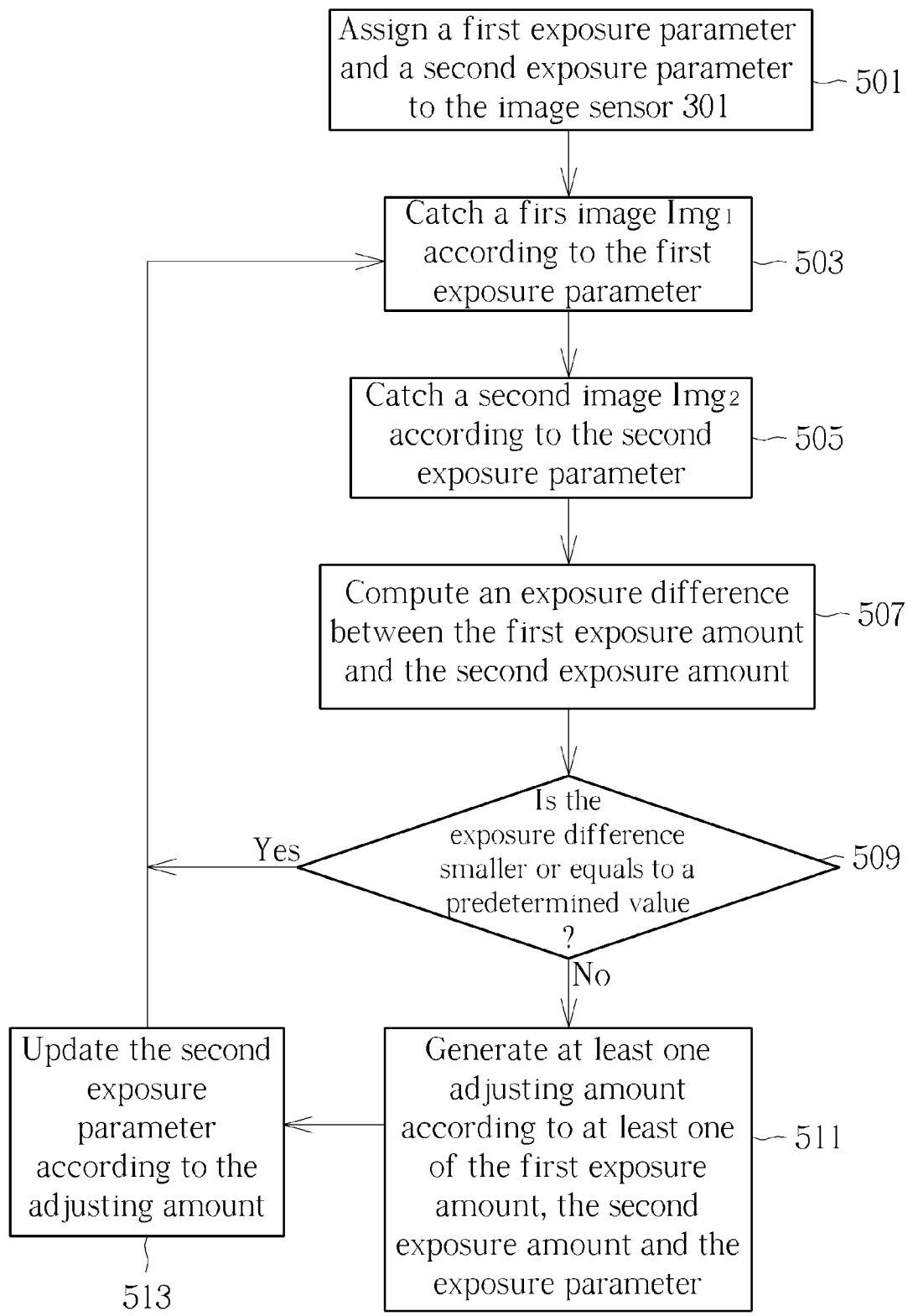
FIG. 5 is a flow chart illustrating the steps that the exposure adjusting apparatus shown in FIG. 3 utilizes to normalize the image.

The image sensed by the image sensor 301 may have different exposure amount even the image sensor 301 utilizes the same exposure parameter to catch an image, due to the environment light or the characteristic of the image. Therefore, an image normalizing operation is needed. The exposure adjusting apparatus 300 can be utilized to normalize the image, that is, control the exposure amount of two images to be the same. In such case, the exposure adjusting apparatus 300 can be regarded as an image normalizing apparatus. FIG. 5 is a flow chart illustrating the steps that the exposure adjusting apparatus shown in FIG. 3 utilizes to normalize the image. Please refer to both FIG. 3 and FIG. 5 to understand the process for adjusting exposure amount according to the present invention for more clear.

First, a first exposure parameter and a second exposure parameter are assigned to the image sensor 301 (step 501). The first exposure parameter and the second exposure parameter can be different or the same. The image sensor 301 catches a firs image $Img_1$ according to the first exposure parameter (step 503), and catches a second image $Img_2$ according to the second exposure parameter (step 505). The computing apparatus 303 computes a first exposure amount of the first image $Img_1$ and a second exposure amount of the second image $Img_2$, and computes an exposure difference between the first exposure amount and the second exposure amount (step 507). The method for computing the exposure amount has been detailedly explained in the above-mentioned embodiments, thus it is omitted for brevity here.

After that, determine if the exposure difference is smaller or equals to a predetermined value (step 509). If yes, back to the step 503 and utilizes the previous first and second exposure parameters to catch the image. If not, generate at least one adjusting amount according to at least one of the first exposure amount, the second exposure amount and the exposure parameter, (step 511). Then, utilize the adjusting amount to update the second exposure parameter to generate a third exposure parameter. After that, back to the step 503 to catch the image via the first exposure parameter and the updated second exposure parameter.

In one embodiment, the exposure updating apparatus 305 utilizes the adjusting amount to increase the second exposure parameter to generate the third exposure parameter when the second exposure amount is smaller than the first exposure amount. The exposure updating apparatus 305 utilizes the adjusting amount to decrease the second exposure parameter to generate the third exposure parameter when the second exposure amount is larger than the first exposure amount. The adjusting amount can be determined by various methods. In one embodiment, the exposure updating apparatus 305 determines the adjusting amount according to the exposure difference. For example, if the first exposure amount is 110, the second exposure amount is 220 and the second exposure parameter is 512 units, the exposure updating apparatus 305 can compute a result that the second exposure amount is 110 if the second exposure parameter is 256 units. By this way, the second exposure amount can be the same as the first exposure amount, such that the adjusting amount is determined to be 256 units and the second exposure parameter is updated to 256 units.

Alternatively, the adjusting amount can equal to a percentage of the second exposure parameter. This percentage can be fixed, that is, the exposure updating apparatus 305 utilizes the same percentage to generate the adjusting amount per time. The percentage can also be variable. For example, the exposure updating apparatus 305 determines the percentage according to at least one of the first exposure parameter, the second exposure parameter and the exposure parameter. In one example, the exposure updating apparatus determines 305 the percentage according to at least one of the first exposure parameter and the second exposure parameter. For example, the percentage is larger if the first exposure parameter or the second exposure parameter is larger, and the percentage is smaller if the first exposure parameter or the second exposure parameter is smaller. In another embodiment, the exposure updating apparatus 305 determines the percentage according to the exposure difference. For example, the percentage is larger if the exposure difference is larger, such that the second exposure amount can be roughly adjusted with a large adjusting amount such that the second exposure amount can be rapidly adjusted to be the same as the first exposure amount. On the contrary, the percentage is smaller if the exposure difference is smaller, such that the second exposure amount can be accurately adjusted to be the same as the first exposure amount.

In view of the embodiment shown in FIG. 5, an image normalizing method can be acquired, which can be performed via executing program code stored in a computer readable media. The image normalizing method includes following steps: catch a first image according to a first exposure parameter and catch a second image according to a second exposure parameter; compute a first exposure amount of the first image and a second exposure amount of the second image, and compute an exposure difference between the first exposure amount and the second exposure amount; if the exposure difference is smaller or equals to a predetermined value, do not adjust the first exposure amount and the second exposure amount; if the exposure difference is larger than a predetermined value, generate at least one adjusting amount according to at least one of the first exposure amount, the second exposure amount and the exposure parameter; utilize the adjusting amount to increase or decrease the second exposure parameter to generate a third exposure parameter; and perform following image catching according to the third exposure parameter.

The above-mentioned exposure adjusting apparatus (or image normalizing apparatus) can be applied to different apparatuses. For example, it can be applied to above-mentioned digital camera or video camera, to improve the exposure of the image. Alternatively, it can be applied to an user interface apparatus such as an optical touch control apparatus or an optical mouse.

Figure 6:
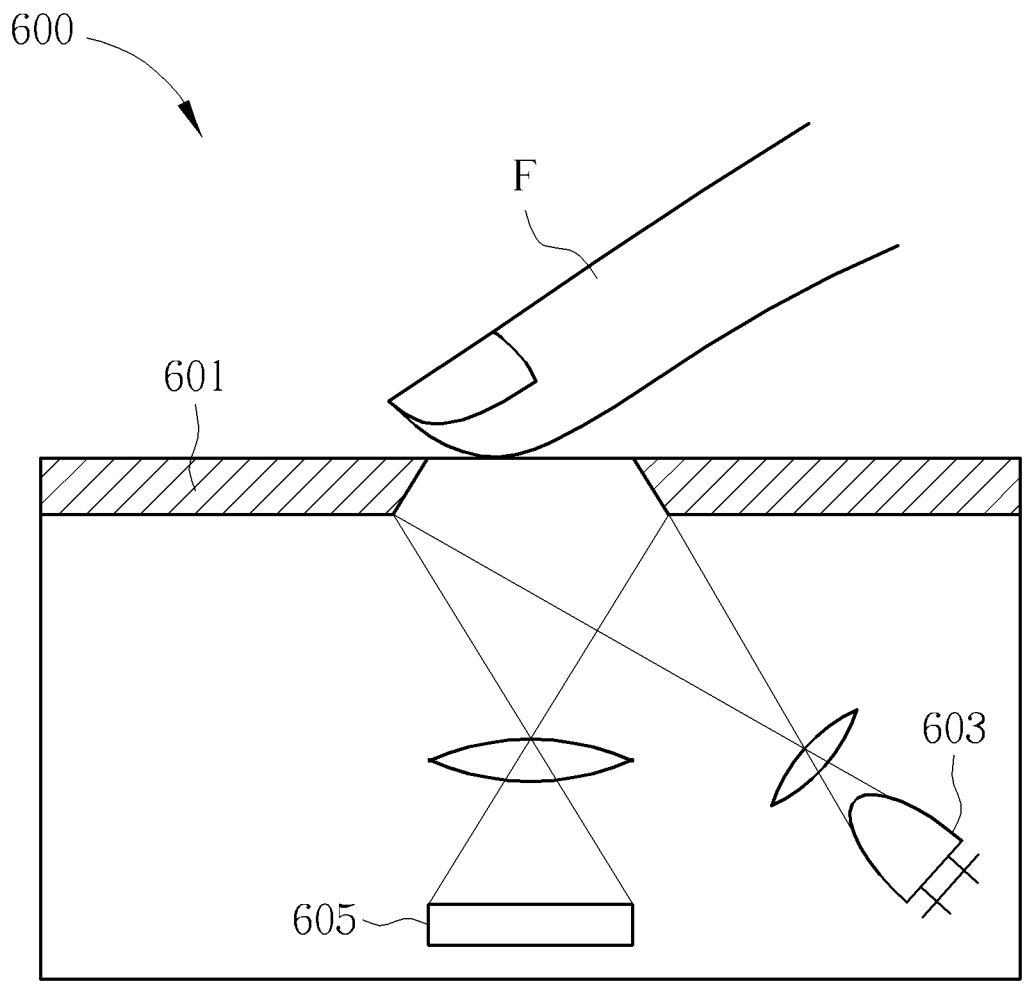
FIG. 6 is a schematic diagram illustrating that the exposure adjusting apparatus shown in FIG. 3 is applied to an optical touch control apparatus.

FIG. 6 is a schematic diagram illustrating that the exposure adjusting apparatus shown in FIG. 3 is applied to an optical touch control apparatus 600. As shown in FIG. 6, the optical touch control apparatus 600 includes a sensing surface 601, a light source 603 and an image sensor 605. The light source 603 emits light to an object on the sensing surface 601 (such as a finger F) to generate an object image. The image sensor 605 detects the displacement of the object relative to the sensing surface 601 according to the object images. The image sensor 605 can rapidly adjust the exposure amount of the object image to a suitable exposure range to more accurately sense the displacement of the object, if the image sensor 605 utilizes the above-mentioned exposure adjusting mechanism.

Figure 7:
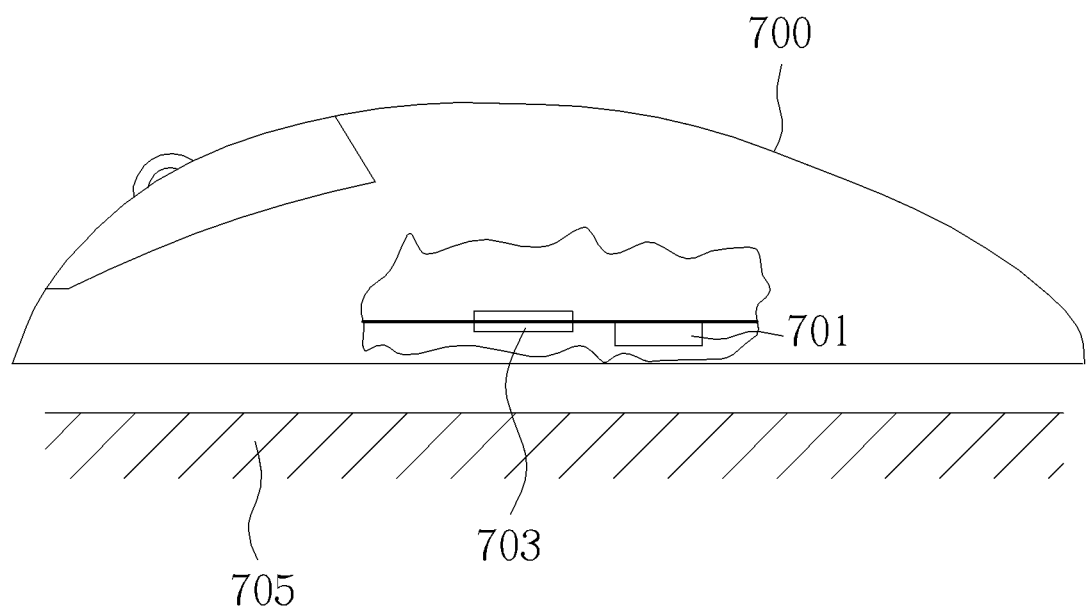
FIG. 7 is a schematic diagram illustrating that the exposure adjusting apparatus shown in FIG. 3 is applied to an optical mouse.

FIG. 7 is a schematic diagram illustrating that the exposure adjusting apparatus 700 shown in FIG. 3 is applied to an optical mouse. As shown in FIG. 7, the adjusting apparatus 700 includes a light source 701 and an image sensor 703. The light source 701 emits light to the surface 705 to generate at least one surface image. The image sensor 703 detects the displacement of the surface 705 relative to the optical mouse 703 according to the surface images. The image sensor 703 can rapidly adjust the exposure amount of the surface image to a suitable exposure range to more accurately sense the displacement of the optical mouse, if the image sensor 703 utilizes the above-mentioned exposure adjusting mechanism.

In view of above-mentioned embodiments, the present invention utilizes a variable adjusting amount to adjust the exposure parameter, such that the exposure amount can be rapidly and accurately adjusted to a desired value or to fall in a desired range. Additionally, the present invention provides a mechanism for determining the adjusting amount via different parameters. By this way, the design for such kind of apparatus can be more unlimited.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An exposure adjusting apparatus, comprising:
   an image sensor, for catching an image according to an exposure parameter;
   a computing apparatus, for computing an exposure amount of the image and for determining whether the exposure amount is in a predetermined exposure range or not; and
   an exposure updating apparatus;
   if the exposure amount is in the predetermined exposure range, the exposure updating apparatus does not adjust the exposure amount;
   if a first exposure difference exists between the exposure amount and the predetermined exposure range, the exposure updating apparatus generates a first adjusting amount, and if a second exposure difference exists between the exposure amount and the predetermined exposure range, the exposure updating apparatus generates a second adjusting amount, wherein the first exposure difference and the second exposure difference do not simultaneously exist;
   wherein the exposure updating apparatus utilizes the first adjusting amount to increase or decrease the exposure parameter to generate a first new exposure parameter if the first exposure difference exists between the exposure amount and the predetermined exposure range, and utilizes the second adjusting amount to increase or decrease the exposure parameter to generate a second new exposure parameter if the second exposure difference exists between the exposure amount and the predetermined exposure range;
   wherein the first adjusting amount equals to a first predetermined percentage of the exposure parameter, and the second adjusting amount equals to a second predetermined percentage of the exposure parameter;
   wherein the first exposure difference is larger than the second exposure difference, and the first predetermined percentage is larger than the second predetermined percentage;
   wherein the first new exposure parameter and the second new exposure parameter are different.

2. A image normalizing apparatus, comprising:
   an image sensor, for catching a first image according to a first exposure parameter and for catching a second image according to a second exposure parameter;
   a computing apparatus, for computing a first exposure amount of the first image and a second exposure amount of the second image, and for computing an exposure difference between the first exposure amount and the second exposure amount; and
   an exposure updating apparatus;
   if the exposure difference is smaller or equals to a predetermined value, the exposure updating apparatus does not adjust the first exposure amount and the second exposure amount;
   if a first exposure difference larger than a predetermined value exists between the first exposure amount and the second exposure amount, the exposure updating apparatus generates a first adjusting amount, and if a second exposure difference larger than the predetermined value exists between the first exposure amount and the second exposure amount, the exposure updating apparatus generates a second adjusting amount, wherein the first exposure difference and the second exposure difference do not simultaneously exist;
   wherein the exposure updating apparatus utilizes the first adjusting amount to increase or decrease the exposure parameter to generate a third exposure parameter if the first exposure difference exists between the first exposure amount and the second exposure amount, and utilizes the second adjusting amount to increase or decrease the second exposure parameter to generate the third exposure parameter if the second exposure difference exists between the first exposure amount and the second exposure amount, wherein the third exposure parameter generated via utilizing the first adjusting amount and the third exposure parameter generated via utilizing the second adjusting amount are different;
   wherein the image sensor performs following image catching according to the third exposure parameter;
   wherein the first adjusting amount equals to a first predetermined percentage of the second exposure parameter, and the second adjusting amount equals to a second predetermined percentage of the second exposure parameter;
   wherein the first exposure difference is larger than the second exposure parameter, and the first predetermined percentage is larger than the second predetermined percentage.

3. A non-transitory computer readable recording medium, having at least one program code recorded thereon, an image normalizing method can be performed when the program code is read and executed, wherein the image normalizing method includes the following steps:
   (a) catching a first image according to a first exposure parameter and for catching a second image according to a second exposure parameter;
   (b) computing a first exposure amount of the first image and a second exposure amount of the second image, and computing an exposure difference between the first exposure amount and the second exposure amount; and
   (c) if the exposure difference is smaller or equals to a predetermined value, not adjusting the first exposure amount and the second exposure amount; generating a first adjusting amount if a first exposure difference larger than a predetermined value exists between the first exposure amount and the second exposure amount, and generating a second adjusting amount if a second exposure difference is larger than the predetermined value exists between the first exposure amount and the second exposure amount, wherein the first exposure difference and the second exposure difference do not simultaneously exist;

(d) utilizing the first adjusting amount to increase or decrease the exposure parameter to generate a third exposure parameter if the first exposure difference exists between the first exposure amount and the second exposure amount, and utilizing the second adjusting amount to increase or decrease the second exposure parameter to generate the third exposure parameter if the second exposure difference exists between the first exposure amount and the second exposure amount, wherein the third exposure parameter generated via utilizing the first adjusting amount and the third exposure parameter generated via utilizing the second adjusting amount are different; and (e) performing following image catching according to the third exposure parameter;

wherein the first adjusting amount equals to a first predetermined percentage of the second exposure parameter, and the second adjusting amount equals a second predetermined percentage of the second exposure parameter;

wherein the first exposure difference is larger than the second exposure difference, and the first predetermined percentage is larger than the second predetermined percentage.

* * * * *